US012628586B2

(12) United States Patent
Shimizu et al.

(10) Patent No.: US 12,628,586 B2
(45) Date of Patent: May 12, 2026

(54) ETCHING METHOD INCLUDING STEPS OF AN OXIDATION PROCESS, A GAS BASED CHEMICAL PROCESS, AND REMOVAL OF CHEMICAL PRODUCTS

(71) Applicant: Tokyo Electron Limited, Tokyo (JP)

(72) Inventors: Akitaka Shimizu, Nirasaki City (JP); Masaki Hosono, Nirasaki City (JP); Kaname Satou, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 729 days.

(21) Appl. No.: 17/643,924

(22) Filed: Dec. 13, 2021

(65) Prior Publication Data

US 2022/0189783 A1     Jun. 16, 2022

(30) Foreign Application Priority Data

Dec. 15, 2020     (JP) ................................ 2020-207625
Sep. 29, 2021     (JP) ................................ 2021-159733

(51) Int. Cl.
*H01L 21/3065* (2006.01)
*H01L 21/311* (2006.01)
*H01L 21/67* (2006.01)

(52) U.S. Cl.
CPC .................. *H01L 21/30655* (2013.01); *H01L 21/31116* (2013.01); *H01L 21/67069* (2013.01)

(58) Field of Classification Search
CPC ......... H01L 21/30655; H01L 21/31116; H01L 21/67069; H01L 21/32137; H01L 21/67167; H01L 21/67742; H01L 21/67173; H01L 21/67196; H01L 21/0214; H01L 21/02164; H01L 21/0223; H01L 21/02252; H01J 37/32357
See application file for complete search history.

(56) References Cited

U.S. PATENT DOCUMENTS

| | | | | |
|---|---|---|---|---|
| 4,300,989 A * | 11/1981 | Chang | ............... | H01L 21/02238 |
| | | | | 427/535 |
| 4,510,016 A * | 4/1985 | Chi | ...................... | H10D 30/202 |
| | | | | 257/E29.243 |
| 4,668,365 A * | 5/1987 | Foster | ................. | H01J 37/3266 |
| | | | | 427/571 |
| 4,894,352 A * | 1/1990 | Lane | ..................... | C23C 16/402 |
| | | | | 252/372 |
| 5,434,109 A * | 7/1995 | Geissler | ........... | H01L 21/02164 |
| | | | | 438/386 |
| JP | 2020025070 | 2/2020 | | |
| KR | 10-1996-0005860 | 2/1996 | | |

(Continued)

FOREIGN PATENT DOCUMENTS

| | | |
|---|---|---|
| JP | 09-260361 A | 10/1997 |
| JP | 2009158774 A | 7/2009 |

(Continued)

*Primary Examiner* — William B Partridge
*Assistant Examiner* — Linda J. Fleck
(74) *Attorney, Agent, or Firm* — Armstrong Teasdale LLP

(57)     ABSTRACT

An etching method of etching Si or SiN existing on a substrate, includes: forming an oxide film on a surface of Si or SiN by performing a radical oxidation process on the substrate having Si or SiN; performing a gas-based chemical process on the oxide film; and removing reaction products produced by the gas-based chemical process, wherein forming the oxide film, the performing the gas-based chemical process, and the removing the reaction products are repeated a plurality of times.

16 Claims, 10 Drawing Sheets

(56) References Cited

U.S. PATENT DOCUMENTS

| 2003/0049390 | A1* | 3/2003 | Shanmugasundram | ..................... G05B 19/19 257/E21.525 |
| 2004/0132317 | A1* | 7/2004 | Morgen | ............ H01L 21/31662 438/770 |
| 2009/0239352 | A1* | 9/2009 | Kitagawa | .......... H01L 21/02238 118/697 |
| 2010/0093179 | A1* | 4/2010 | Hori | .................. H01L 21/02238 438/723 |
| 2011/0061812 | A1* | 3/2011 | Ganguly | ............. H01L 21/6719 156/345.1 |
| 2012/0177462 | A1* | 7/2012 | Fritzinger | ............ A61B 17/861 411/413 |
| 2014/0113450 | A1* | 4/2014 | Uda | .................. H01L 21/67069 438/694 |
| 2015/0364338 | A1* | 12/2015 | Ranjan | .............. H01L 29/66795 438/716 |
| 2016/0211147 | A1* | 7/2016 | Fukazawa | ......... H01L 21/67069 |
| 2017/0271165 | A1 | 9/2017 | Kal et al. | |
| 2019/0115422 | A1* | 4/2019 | Akcasu | ................... H01L 29/94 |
| 2021/0028187 | A1* | 1/2021 | Byeon | .............. H01L 21/02315 |
| 2021/0151326 | A1* | 5/2021 | Shimizu | ........... H01L 21/31116 |
| 2021/0358772 | A1* | 11/2021 | Igarashi | ............ H01L 21/67069 |
| 2023/0107264 | A1* | 4/2023 | Takata | ............. H01L 21/67063 438/706 |
| 2024/0203694 | A1* | 6/2024 | Sako | ................. H01J 37/32724 |

FOREIGN PATENT DOCUMENTS

| KR | 10-2009-0071368 | A | 7/2009 |
| KR | 10-2020-0013606 | A | 2/2020 |
| WO | 2020066172 | A1 | 4/2020 |

* cited by examiner

FIG. 1

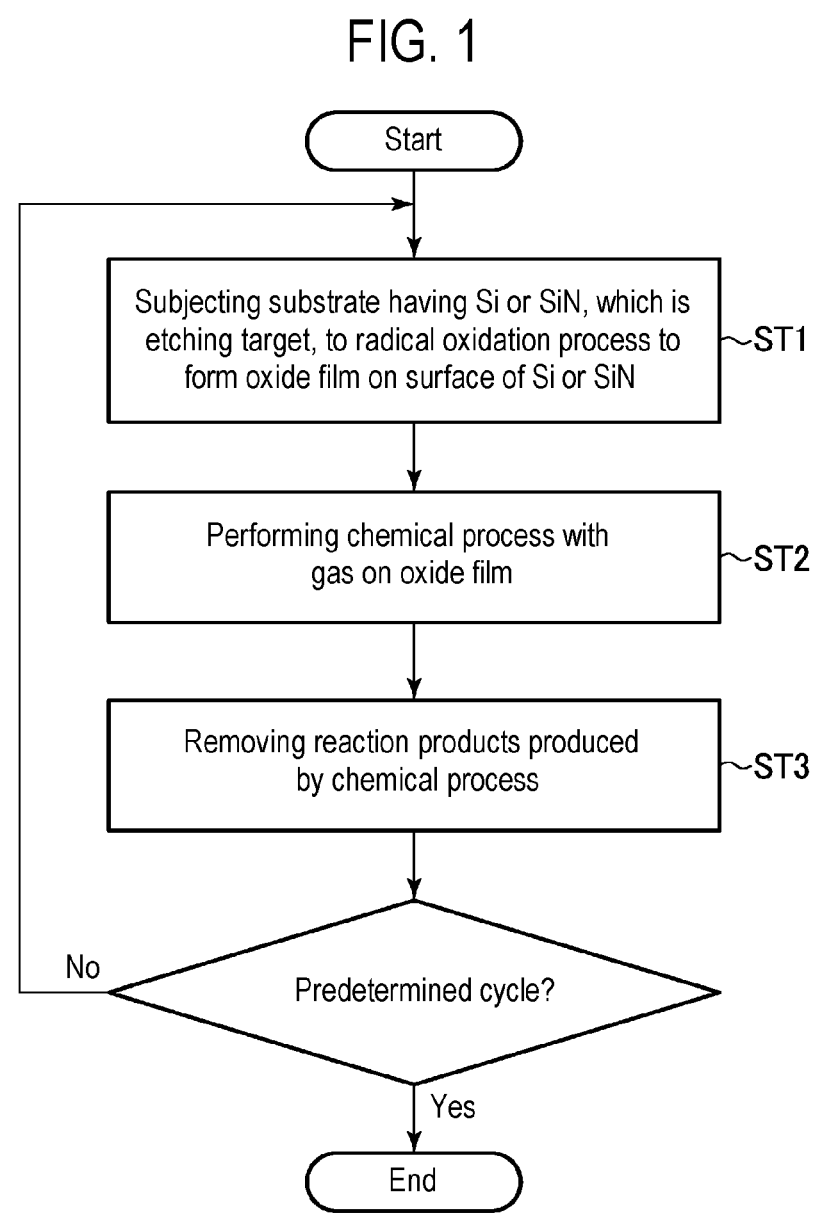

```
        ┌─────────────┐
        │    Start     │
        └─────────────┘
               │
               ▼
┌───────────────────────────────────────┐
│ Subjecting substrate having Si or SiN, │
│ which is etching target, to radical    │──ST1
│ oxidation process to form oxide film   │
│ on surface of Si or SiN                │
└───────────────────────────────────────┘
               │
               ▼
┌───────────────────────────────────────┐
│     Performing chemical process with   │──ST2
│          gas on oxide film             │
└───────────────────────────────────────┘
               │
               ▼
┌───────────────────────────────────────┐
│    Removing reaction products produced │──ST3
│         by chemical process            │
└───────────────────────────────────────┘
               │
               ▼
        ┌─────────────────┐
   No   ╱                   ╲
◄───────  Predetermined cycle?
        ╲                   ╱
        └─────────────────┘
               │ Yes
               ▼
        ┌─────────────┐
        │     End      │
        └─────────────┘
```

Top>Btm
160mTorr1%NF$_3$/O$_2$/H$_2$

Top=Btm
50mTorr0%NF$_3$/O$_2$/H$_2$

Top<Btm
50mTorr4%NF$_3$/O$_2$/H$_2$

High pressure condition
Top-first

Low pressure condition
Uniform

High pressure+$NF_3$ addition
Top-first

Low pressure+$NF_3$ addition
Btm-first

ETCHING METHOD INCLUDING STEPS OF AN OXIDATION PROCESS, A GAS BASED CHEMICAL PROCESS, AND REMOVAL OF CHEMICAL PRODUCTS

CROSS-REFERENCE TO RELATED APPLICATIONS

This application is based upon and claims the benefit of priority from Japanese Patent Application Nos. 2020-207625 and 2021-159733, filed on Dec. 15, 2020, and Sep. 29, 2021, respectively, the entire contents of which are incorporated herein by reference.

TECHNICAL FIELD

The present disclosure relates to an etching method and an etching apparatus.

BACKGROUND

In the process of manufacturing a semiconductor device, there is a process of etching and slimming silicon (Si) or silicon nitride (SiN). Wet etching is often used in etching in such a process. For example, Patent Document 1 discloses a method of etching polysilicon by wet etching.

PRIOR ART DOCUMENT

Patent Document

Patent Document 1: Japanese Laid-Open Patent Publication No. H09-260361

SUMMARY

According to one embodiment of the present disclosure, there is provided an etching method of etching Si or SiN existing on a substrate, which includes: forming an oxide film on a surface of the Si or the SiN by performing a radical oxidation process on the substrate having the Si or the SiN; performing a gas-based chemical process on the oxide film; and removing reaction products produced by the gas-based chemical process, wherein the forming the oxide film, the performing the gas-based chemical process, and the removing the reaction products are repeated a plurality of times.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart showing an example of an etching method according to an embodiment.

FIG. 2 is a flowchart showing another example of the etching method according to the embodiment.

FIG. 4 is a view showing a state in which a poly-Si film serving as a channel in the structure of FIG. 3 is etched.

FIG. 9 is a partial cross-sectional plan view schematically showing an example of a processing system used in the etching method of the embodiment.

FIG. 10 is a cross-sectional view schematically showing an example of a process module provided to the processing system of FIG. 9 and functioning as an etching apparatus for carrying out the etching method of the embodiment.

DETAILED DESCRIPTION

Figure 3:
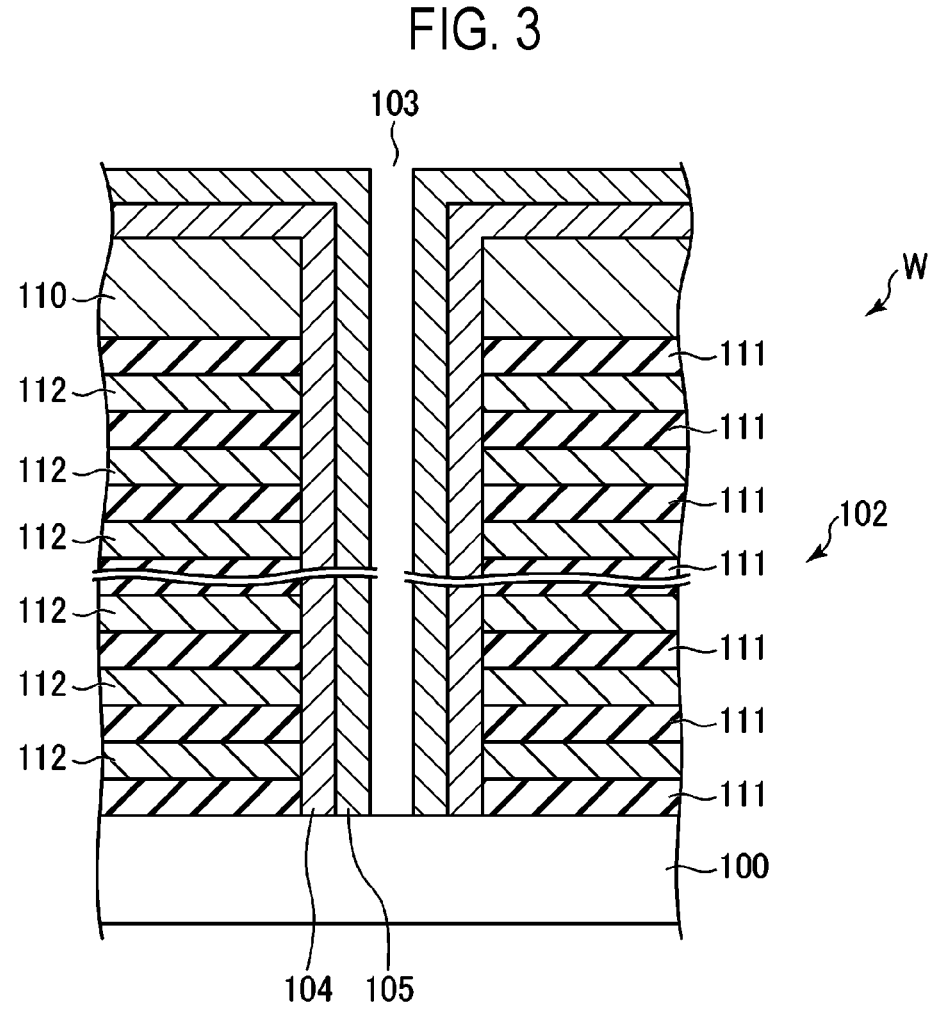
FIG. 3 is a cross-sectional view showing an example of a structure of a substrate to which the etching method of the embodiment is applied.

Hereinafter, embodiments will be described with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Etching Method>

FIG. 1 is a flowchart showing an example of an etching method according to an embodiment.

The etching method according to the present embodiment is to etch Si or SiN existing on a substrate. First, a substrate having Si or SiN, which is an etching target, is subjected to a radical oxidation process to form an oxide film on the surface of Si or SiN (in step ST1). Subsequently, the oxide film is chemically processed with a gas (in step ST2). Subsequently, reaction products produced by the chemical process in step ST2 are removed (in step ST3). These steps ST1 to ST3 are repeated a plurality of times. As a result, Si or SiN existing on the substrate is etched by a desired amount.

Hereinafter, detailed description will be given. The radical oxidation process in step ST1 generates oxygen-containing plasma and causes oxygen radicals (O radicals) in the oxygen-containing plasma to act on the substrate accommodated in a process container to form the oxide film ($SiO_2$ film) on the surface of Si or SiN. At this time, remote plasma may be used so that mainly O radicals in the oxygen-containing plasma can be supplied to the substrate. The remote plasma generates plasma of an oxygen-containing gas in a plasma generation space separate from a processing space in which the substrate is placed, and transfers the generated plasma to the processing space. Since oxygen ions ($O_2$ ions) in the oxygen-containing plasma are easily deactivated during the transfer, O radicals are mainly supplied to the processing space. Ion damage to the substrate can be reduced by the action of O radicals mainly on the substrate. A plasma source is not particularly limited, and may employ inductively-coupled plasma, microwave plasma, or the like.

Further, the oxygen-containing gas for generating the oxygen-containing plasma used at this time may be an $O_2$ gas alone, or may be a mixed gas of an $O_2$ gas and at least one of a $H_2$ gas, a fluorine (F)-containing gas, and a noble gas. As the F-containing gas, a $NF_3$ gas, a $SF_6$ gas, a $F_2$ gas, or the like may be used. Of these, the $NF_3$ gas is suitable. The noble gas is not particularly limited, but an Ar gas may be used. Oxidation ability may be enhanced by adding the $H_2$ gas. F radicals are generated by adding the F-containing gas, and the oxide film and Si are etched by the F radicals. A ratio of the F-containing gas may be 0.5 to 5% for F-containing gas/$O_2$ gas. A ratio of the $H_2$ gas may be 0 to 80% for $H_2$ gas/($O_2$ gas+$H_2$ gas). Further, the plasma may be stabilized by adding the noble gas.

A pressure in step ST1 may be 25 to 500 mTorr (3.33 to 66.7 Pa). A substrate temperature may be 15 to 120 degrees C. A time period of step ST1 may be in a range of 60 to 180 secs. A flow rate of each gas may be appropriately set according to the apparatus.

In a process of chemically processing the oxide film in step ST2 with a gas, an example of the gas-based chemical process may include a chemical process using a process gas including an F-containing gas. By this process, the oxide film and the process gas are reacted with each other to produce a compound that can be removed by heating or the like.

An example of the F-containing gas included in the process gas may include a hydrogen fluoride (HF) gas, and examples of gases other than the F-containing gas may include a $H_2O$ gas and a reducing gas. Examples of the reducing gas may include an ammonia ($NH_3$) gas and an amine-based gas. By reacting the F-containing gas and the $H_2O$ gas or the reducing gas with the oxide film, a compound that can be removed relatively easily can be produced.

Among these, the HF gas may be used as the fluorine-containing gas and the $NH_3$ gas may be used as the reducing gas. The HF gas and the $NH_3$ gas can be used to perform a chemical oxide removal (COR) process, which is known as an oxide removal process in the related art. In the COR process, the HF gas and the $NH_3$ gas are adsorbed onto the surface of the oxide film and are reacted with the oxide film to produce ammonium fluorosilicate (AFS), which is an ammonium fluoride-based compound.

In such a COR process, a pressure may be in a range of 6.66 to 400 Pa (50 to 3,000 mTorr), more specifically in a range of 13.3 to 266.6 Pa (100 to 2,000 mTorr). A substrate temperature at this time may be in a range of 0 to 120 degrees C., more specifically in a range of 20 to 100 degrees C.

Step ST2 may be performed in the same process container as step ST1. Throughput may be increased by performing step ST2 in the same process container. Of course, these steps may be performed in separate process containers.

Figure 2:
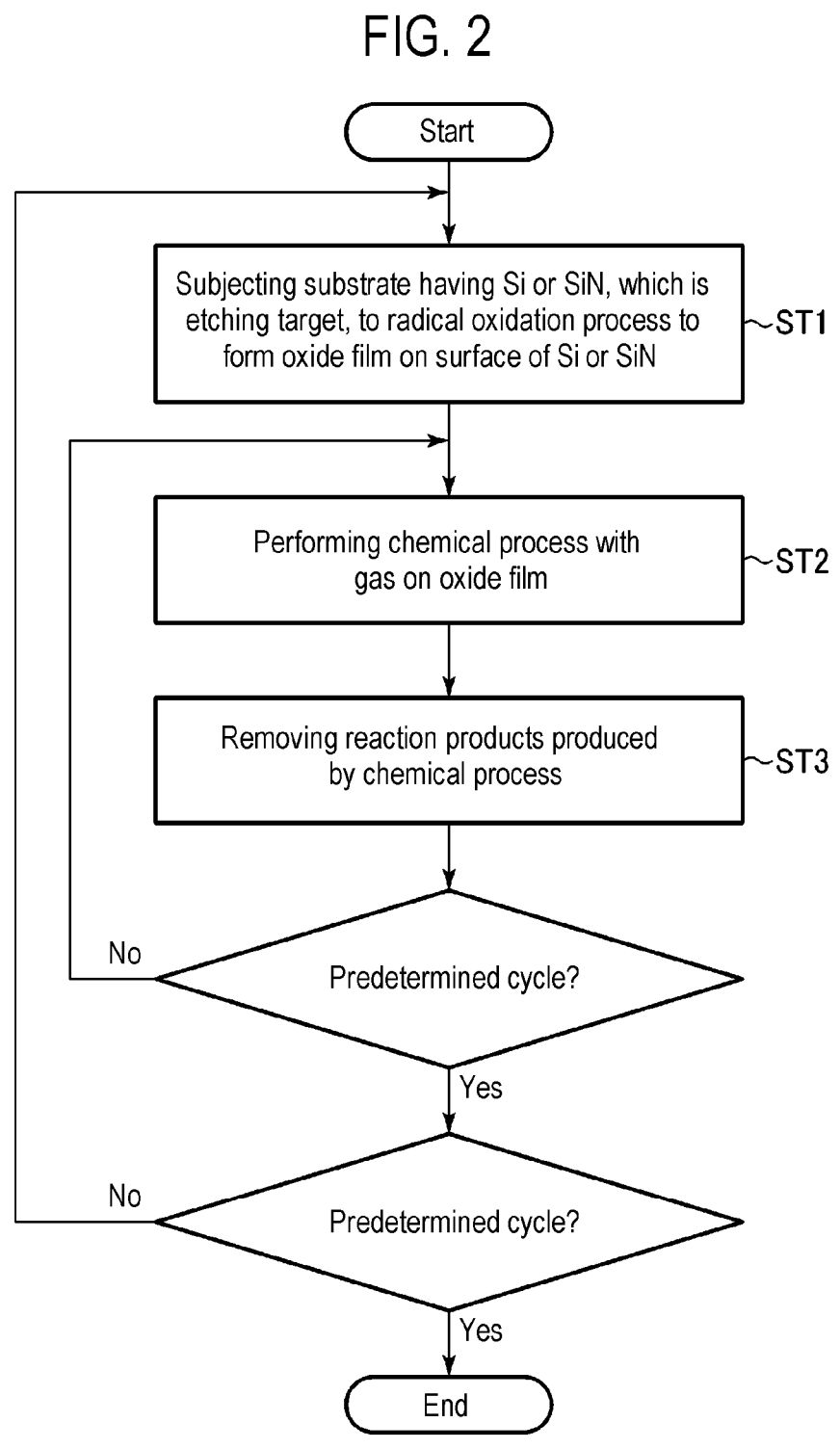

A process of removing the reaction products in step ST3 is performed by supplying an inert gas into the process container while exhausting the process container in a state where the substrate is kept at a desired temperature. This process may be performed in the same process container as that used in the gas-based chemical process in step ST2, or may be performed in a separate process container. In either case, the substrate temperature may be appropriately set and may be the same as or different from that in step ST2. However, when step ST3 is performed in the same process container as that in step ST2, the throughput may be increased by performing step ST3 at the same substrate temperature as that in step ST2. When step ST3 is performed in a process container separate from that in step ST2, the substrate may be heated to, for example, 190 to 300 degrees C. to promote the removal of the reaction products. Further, as shown in FIG. 2, steps ST2 and ST3 may be repeated. In particular, since SiN may be etched by the HF/$NH_3$ gas when SiN is COR-processed, it is preferable to prevent SiN from being etched by using an incubation time by repeating step ST2 and step ST3 in a short period of time. When step ST2 and step ST3 are repeated, these steps may be performed in the same process container, or may be performed in separate process containers.

Further, depending on a gas type and conditions such as temperature and pressure, step ST2 and step ST3 may be performed at the same time. For example, by performing the COR process at a temperature at which AFS is decomposed, the gas-based chemical process in step ST2 and the process of removing the reaction products in step ST3 may be proceed at the same time. Further, after all the processes are completed, heat treatment for removing the residues may be performed in a separate process container.

In conventional wet etching of Si, since the etching progresses along a crystal grain boundary or a crystal plane of Si, the roughness of the surface of Si deteriorates. In contrast, in the present embodiment, the formation of the oxide film on the Si surface by the plasma oxidation process and the removal of the oxide film by a process including the gas-based chemical process are repeated. At this time, since the radical oxidation process is a surface reaction by oxygen radicals, a thin oxide film is formed without depending on the crystal grain boundary or the crystal plane and then only the thin oxide film is removed, the surface roughness is good. Then, by repeating the formation of the oxide film and the removal of the oxide film a desired number of times, a desired amount of etching can be performed with enhanced controllability.

In practice, a poly-Si blanket wafer was etched by the etching method of the present embodiment in order to confirm the surface roughness. Here, 4 to 22 cycles of performing a radical oxidation step at 400 to 1,250 mTorr and then performing an oxide film removal step including a COR process and an AFS removal process were performed, and the average film thickness and the surface roughness were measured. As the surface roughness, Ra was measured. As a result, the average etching amount was 3.61 to 16.49 nm, and Ra was 0.1656 nm in 4 cycles, 0.1986 nm in 15 cycles, 0.1988 nm in 18 cycles, and 0.2068 nm in 22 cycles. This is almost the same value as the initial surface roughness of 0.127 nm, whereby it was confirmed that the surface roughness is good. In contrast, in the case of wet etching, Ra was 0.6 nm, which was almost three times the value compared to the present embodiment.

The structure of the substrate to which the etching method of the present embodiment is applied to is not particularly limited, and an example thereof may include a structure used in a 3D-NAND nonvolatile semiconductor device. FIG. 3 is a cross-sectional view showing an example of such a substrate structure.

Figure 4:
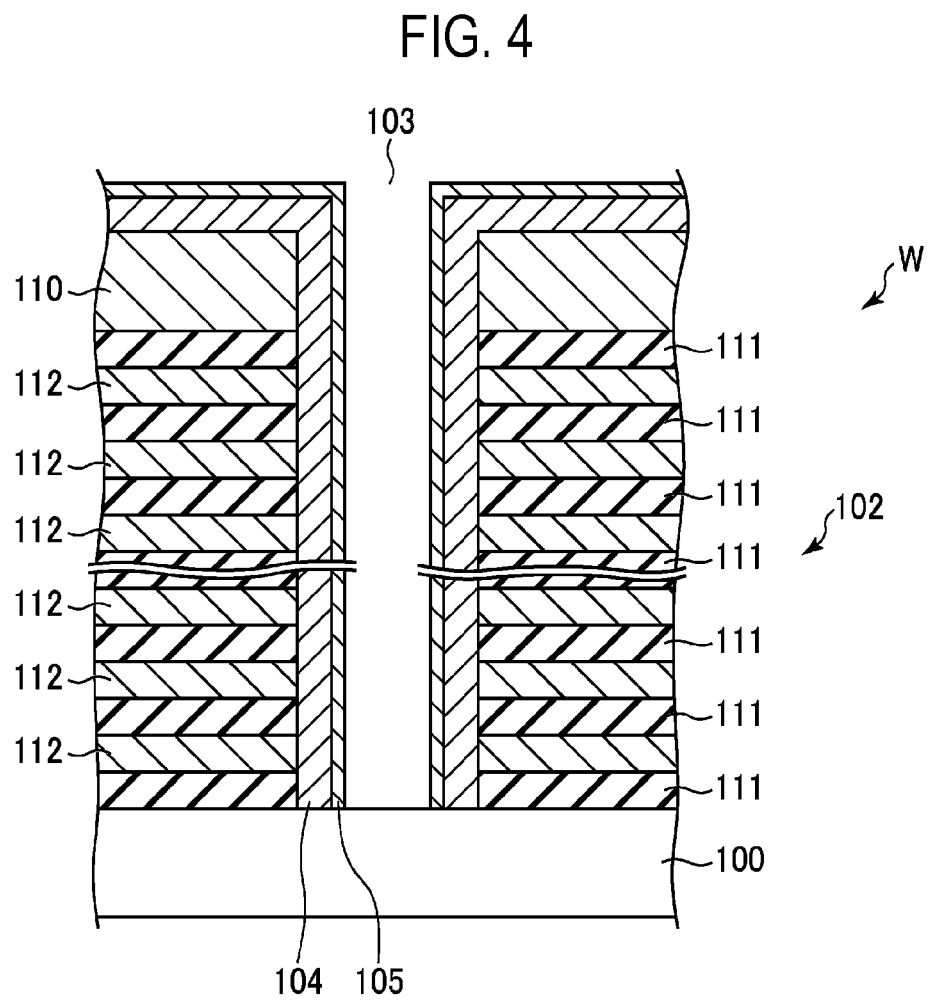

In this example, a semiconductor wafer (wafer) W, which is a substrate, has an ONON stacked structure portion 102 in which a plurality of $SiO_2$ films 111 and SiN films 112 are alternately stacked on a silicon base body 100. The number of stacked layers of $SiO_2$ films 111 and SiN films 112 is actually about one hundred. An upper structure 110 is provided on the ONON stacked structure portion 102. A memory hole 103 penetrating in the stacking direction of the upper structure 110 and the ONON stacked structure portion 102 is formed. A multi-layered memory film 104 and a Si film 105 serving as a channel are formed in the memory hole 103. The Si film 105 is a crystalline Si film. In this example, as shown in FIG. 4, the Si film 105 as the channel is etched and slimmed.

Figure 5:
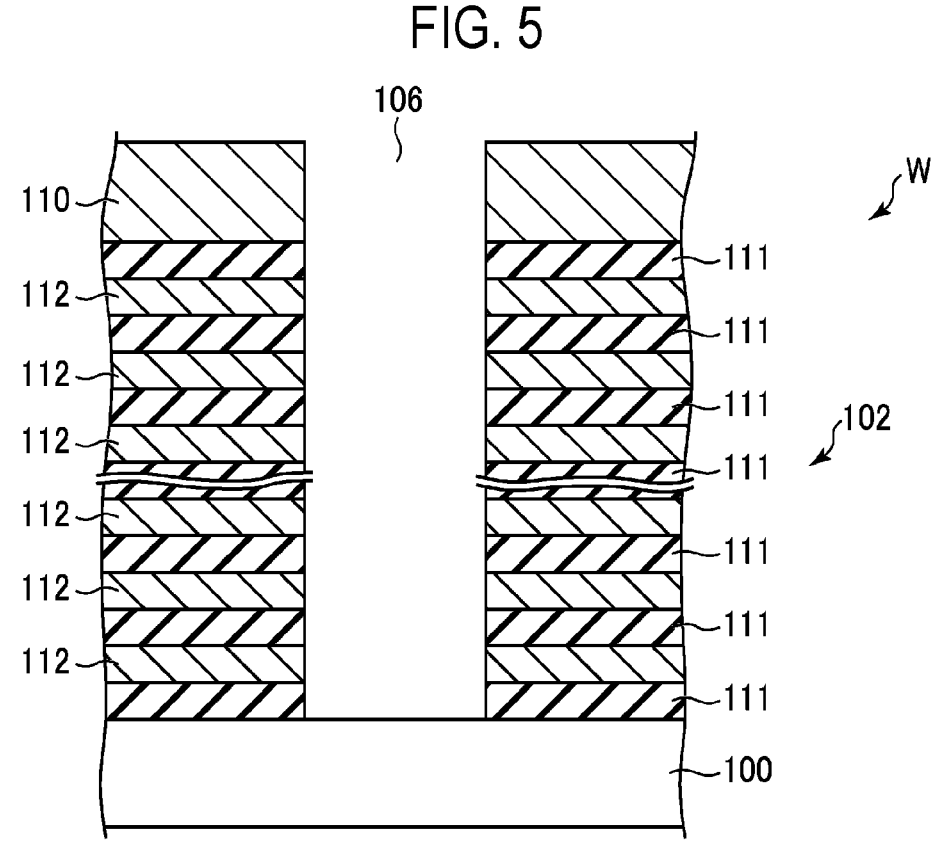
FIG. 5 is a cross-sectional view showing another example of the structure of the substrate to which the etching method of the embodiment is applied.
Figure 6:
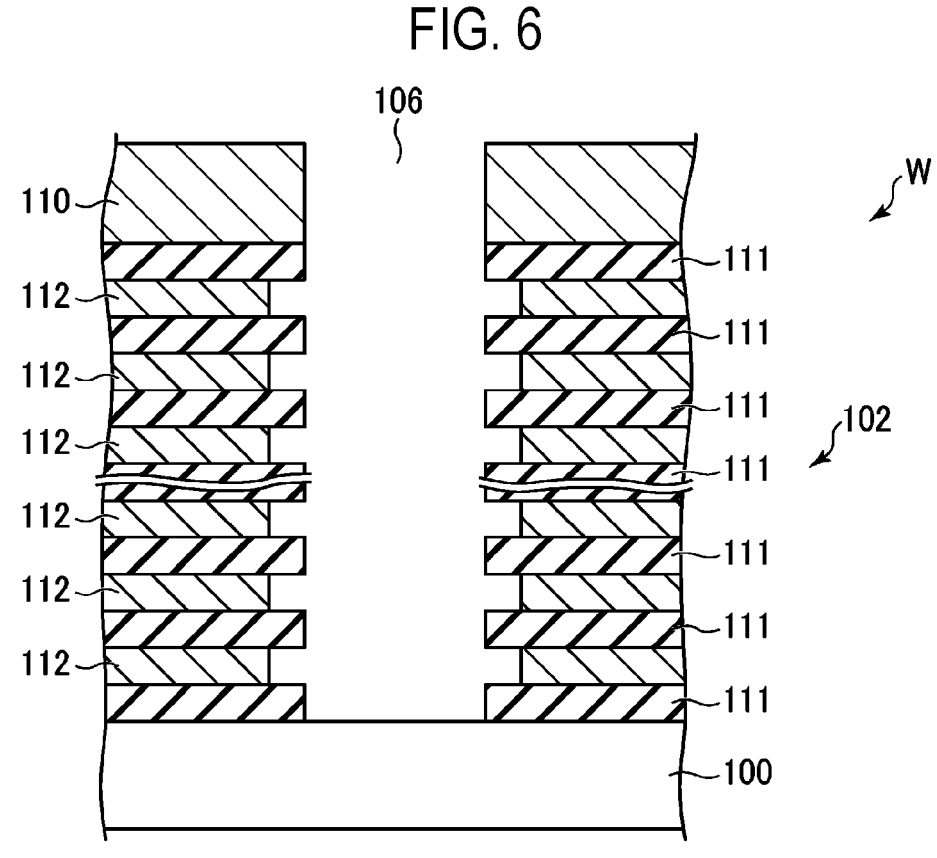
FIG. 6 is a cross-sectional view showing a state in which a SiN film of an ONON stacked structure portion is recess-etched, in the structure of FIG. 5.

FIG. 5 is a cross-sectional view showing another example of the structure of the substrate used in a 3D-NAND nonvolatile semiconductor device. In this example, similarly, a wafer W, which is a substrate, has an ONON stacked structure portion 102 in which a plurality of $SiO_2$ films 111 and SiN films 112 are alternately stacked on a silicon base body 100, and an upper structure 110. A slit 106 penetrating in the stacking direction is formed in the upper structure 110 and the ONON stacked structure portion 102. In this example, as shown in FIG. 6, the plurality of SiN films 112 of the ONON stacked structure portion 102 are recess-etched by about 3 to 5 nm.

In such a 3D-NAND nonvolatile semiconductor device, the memory hole 103 and the slit 106 are very deep. In such a deep recess, an oxide film having desired film thickness uniformity in the depth direction may not be obtained by top-bottom loading (loading between the frontage and the deepest portion) during oxidation process of Si and SiN existing on the side surface of the recess. Such top-bottom loading is not limited to the 3D-NAND nonvolatile semiconductor device, and becomes a problem in etching the side surface portion of the recess having a depth of 4 μm or more.

As a method of controlling the top-bottom loading, it has been found that it is effective to adjust a pressure in the radical oxidation process and/or a ratio of F-containing gas in an oxygen-containing gas.

Figures 7A, 7B, 7C:
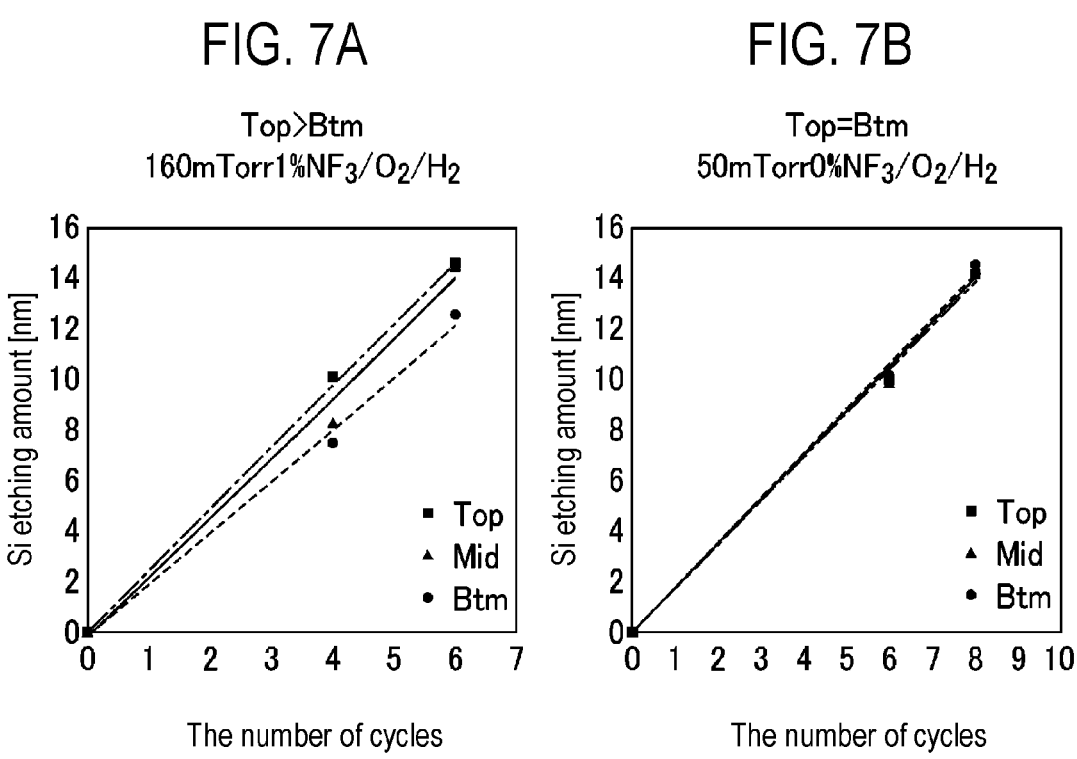
FIGS. 7A to 7C are diagrams showing a relationship between the number of cycles of Top, Mid, and Btm and an amount of Si etching when conditions of a radical oxidation step are changed in the structure of FIG. 3 to repeat the radical oxidation step and an oxide removal step.

FIGS. 7A to 7C are diagrams showing a relationship between the number of cycles of Top, middle (Mid), and bottom (Btm) and the amount of Si etching when the conditions of the radical oxidation step are changed in the structure of FIG. 3 to repeat the radical oxidation step and the oxide removal step. As shown in FIG. 7A, it can be seen that, when the radical oxidation step is performed under the high pressure condition (160 mTorr), the etching amount is larger in Top rather than Btm, which refers to Top-first. As shown in FIG. 7B, it can be seen that, when the radical oxidation step is performed under the low pressure condition (50 mTorr), the etching amount is substantially the same for Top and Btm, which refers to uniform etching. As shown in FIG. 7C, it can be seen that, when the radical oxidation step is performed under the low pressure condition (50 mTorr) and 4% of $NF_3$ is added to an $O_2$ gas, the etching amount is larger in Btm rather than Top, which refers to Btm-first.

From these results, it can be seen that the etching characteristics can be adjusted to Top>Btm, Top=Btm, and Top<Btm by adjusting the pressure in the radical oxidation step and $NF_3/O_2$. That is, it was confirmed that the etching amount can be adjusted to any of Top>Btm, Top=Btm, and Top<Btm by changing the pressure in the radical oxidation step and/or the ratio of the F-containing gas in the oxygen-containing gas, thereby controlling the top-bottom loading.

Next, an estimation mechanism capable of controlling the top-bottom loading in this way will be described. FIGS. 8A to 8D are views showing the estimation mechanism in which the top-bottom loading can be controlled by the pressure in the radical oxidation process and the ratio of $NF_3$ gas which is an F-containing gas.

Figures 8A, 8B, 8C, 8D:
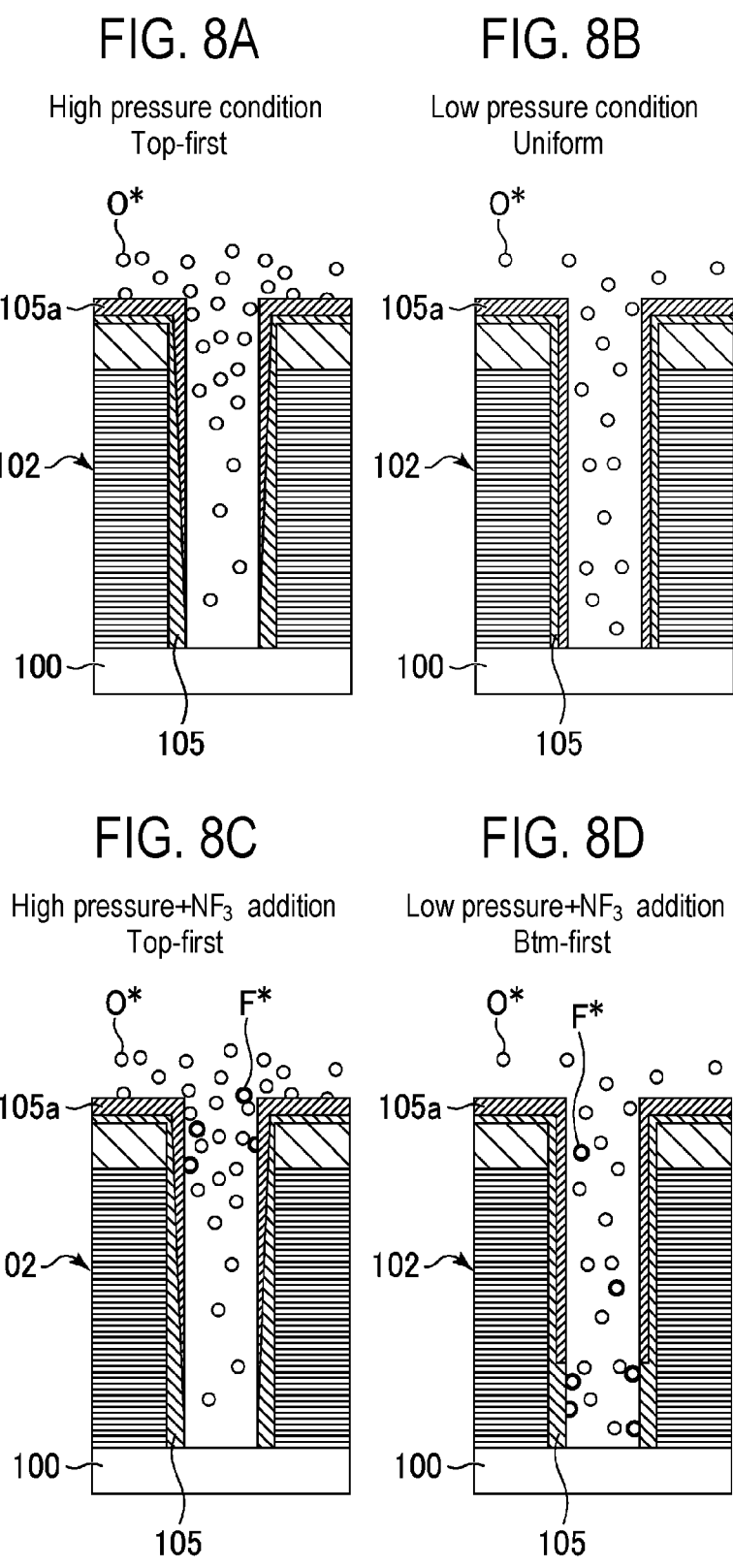
FIGS. 8A to 8D are views showing an estimation mechanism in which a top-bottom loading can be controlled by a pressure during a radical oxidation process and a ratio of a $NF_3$ gas which is an F-containing gas.

Under the high pressure condition as shown in FIG. 8A, the mean free path is short, which prevents the O radicals from reaching the bottom. The O radicals attack mainly the Top portion of the Si film 105, a generated oxide film 105a has a thick Top portion, and the etching of the Si film 105 becomes Top-first. Further, under the low pressure condition as shown in FIG. 8B, since the mean free path is long, the O radical also reaches the bottom. Therefore, the O radicals uniformly attack the Si film 105, a generated oxide film 105a has a uniform thickness, and the Si film 105 is uniformly etched. FIG. 8C shows a case in which the radical oxidation process is performed under the high pressure condition and where the $NF_3$ gas is added. Under this condition, the mean free path is short, which prevents both O radicals and F radicals from reaching the bottom. The O radicals generate the oxide film 105a mainly on the Top portion of the Si film 105. The F radicals etches the oxide film 105a in the Top portion, but such an etching action is weak. Thus, the etching of the Si film 105 becomes the Top-first as in FIG. 8A. FIG. 8D shows a case in which the radical oxidation process is performed under the low pressure condition and where the $NF_3$ gas is added. Under this condition, the mean free path is long, the O radicals attack the Si film 105 uniformly. On the other hand, the F radicals easily moves to the bottom and etches the Si film 105 in the bottom. As a result, the etching of the Si film 105 becomes the Btm-first.

Example of Processing System

Figure 9:
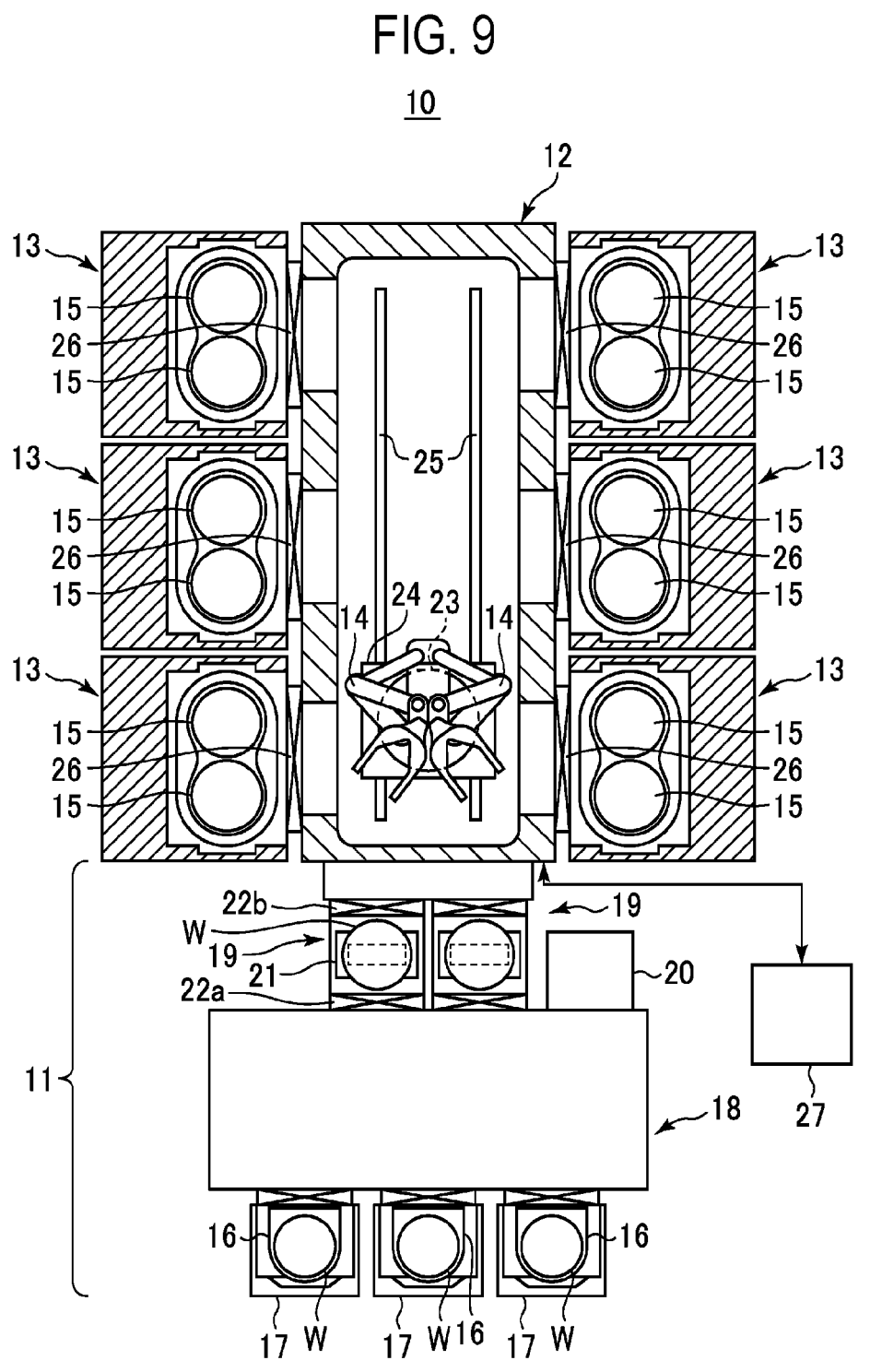

Next, an example of a processing system used in the etching method of the present embodiment will be described. FIG. 9 is a partial cross-sectional plan view schematically showing an example of the processing system used in the etching method of the present embodiment.

As shown in FIG. 9, the processing system 10 includes a loading/unloading part 11 in which a plurality of substrates W is stored and loading/unloading of the substrates W is performed, a transfer module 12 as a transfer chamber in which two substrates W are simultaneously transferred, and a plurality of process modules 13 that process the substrates W loaded from the transfer module 12. The interiors of each process module 13 and the transfer module 12 are kept in a vacuum atmosphere.

In the processing system 10, the substrates W stored in the loading/unloading part 11 are transferred by a transfer arm 14 built in the transfer module 12, and are placed one by one on each of two stages 15 arranged inside the process module 13. Subsequently, in the processing system 10, each substrate W placed on each stage 15 is processed by the process module 13, and then the processed substrate W is transferred to the loading/unloading part 11 by the transfer arm 14.

The loading/unloading part 11 includes a plurality of load ports 17 as stages for a FOUP 16 which is a container for accommodating the plurality of substrates W, a loader module 18 that receives the stored substrate W from the FOUP 16 placed on each load port 17 or hands over the substrate W processed by the process module 13 to the FOUP 16, two load lock modules 19 that temporarily hold the substrates W to deliver the substrates W between the loader module 18 and the transfer module 12, and a cooling storage 20 that cools the substrates W subjected to heat treatment.

The loader module 18 is composed of a rectangular housing whose interior is in an atmospheric pressure atmosphere. The plurality of load ports 17 are arranged side by side on one side surface constituting the long side of the rectangular housing. Further, the loader module 18 includes a transfer arm (not shown) that can move in the longitudinal direction inside the rectangular housing. The transfer arm loads the substrate W into the load lock module 19 from the FOUP 16 placed on each load port 17, or unloads the substrate W from the load lock module 19 to each FOUP 16.

Each load lock module 19 temporarily holds the substrate W in order to hand over the substrate W accommodated in the FOUP 16 placed on each load port 17 in the atmospheric pressure atmosphere to the process module 13 whose interior is in the vacuum atmosphere. Each load lock module 19 includes a buffer plate 21 that holds two substrates W.

Further, each load lock module 19 includes a gate valve 22*a* for ensuring airtightness for the loader module 18, and a gate valve 22*b* for ensuring airtightness for the transfer module 12. Further, a gas introduction system and a gas exhaust system (not shown) are connected to the load lock modules 19 via pipes, so that the interior of each load lock module 19 can be switched between the atmospheric pressure atmosphere and the vacuum atmosphere.

The transfer module 12 loads an unprocessed substrate W from the loading/unloading part 11 into the process module 13, and unloads a processed substrate W from the process module 13 to the loading/unloading part 11. The transfer module 12 is composed of a rectangular housing whose interior is in a vacuum atmosphere, and includes two transfer arms 14 that hold and move two substrates W, a rotary table 23 that rotably supports each transfer arm 14, a rotary stage 24 on which the rotary table 23 is placed, and a guide rail 25 that guides the rotary stage 24 so as to be movable in the longitudinal direction of the transfer module 12. Further, the transfer module 12 is connected to the load lock modules 19 of the loading/unloading part 11, and each process module 13 via the gate valve 22*b* and each gate valve 26 to be described later. In the transfer module 12, the transfer arm 14 transfers two substrates W from the load lock module 19 to each process module 13, and unloads two processed substrates W from each process module 13 to another process module 13 or the load lock module 19.

In the processing system 10, each process module 13 is used to etch Si or SiN, which is an etching target portion. The process module 13 may collectively perform steps ST1 to ST3, or may separately include a process module for performing steps ST1 and ST2 and a process module 13 for performing step ST3.

The processing system 10 includes a control part 27. The control part 27 includes a main controller having a CPU that controls the operation of each constituent element of the processing system 10, an input device (a keyboard, a mouse, etc.), an output device (a printer, etc.), a display device (a display, etc.), and a storage device (storage medium). The main controller of the control part 27 causes the processing system 10 to execute a predetermined operation based on, for example, a non-transitory computer readable storage medium built in the storage device or a process recipe that is set in the storage device and stored in the storage medium.

<Etching Apparatus>

Figure 10:
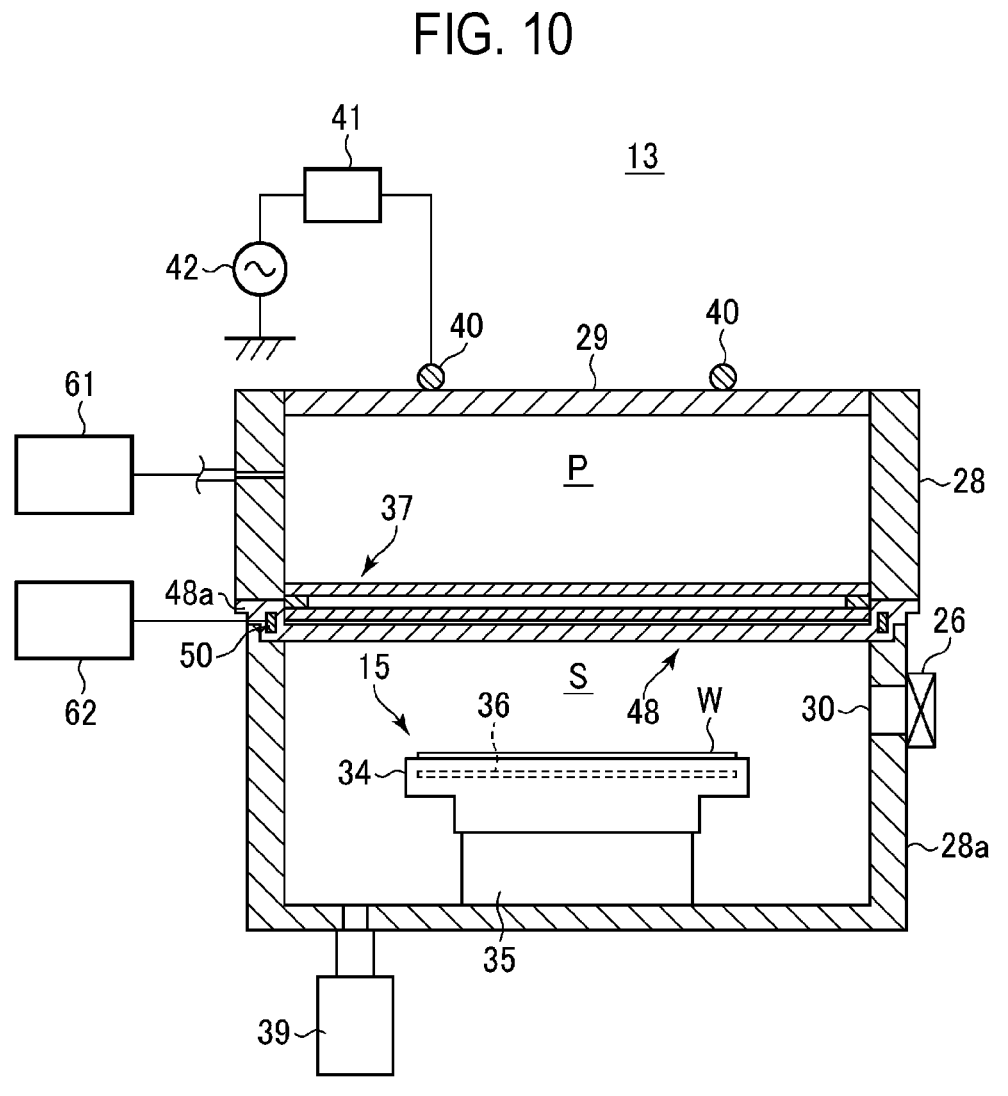

Next, an example of the process module 13 that is provided in the processing system 10 and functions as an etching apparatus for carrying out the etching method according to the present embodiment will be described. FIG. 10 is a cross-sectional view schematically showing an example of the process module 13 that functions as an etching apparatus in the processing system of FIG. 9.

As shown in FIG. 10, the process module 13 functioning as an etching apparatus includes a process container 28 having a closed structure for accommodating the substrate W. The process container 28 is made of, for example, aluminum or an aluminum alloy, with its upper end opened. The upper end of the process container 28 is closed by a lid 29 serving as a ceiling portion. A loading/unloading port 30 for the substrate W is provided in a sidewall portion 28*a* of the process container 28 and can be opened/closed by the above-mentioned gate valve 26.

Further, as described above, the two stages 15 (only one of which is shown) on which the substrate W is placed one by one in a horizontal state are arranged on the bottom of the interior of the process container 28. Each stage 15 has substantially a columnar shape and includes a placement plate 34 on which the substrate W is directly placed, and a base block 35 that supports the placement plate 34. A temperature regulation mechanism 36 for regulating a temperature of the substrate W is provided inside the placement plate 34. The temperature regulation mechanism 36 includes, for example, a pipeline (not shown) through which a temperature regulation medium circulates, and regulates the temperature of the substrate W by exchanging heat between the temperature regulation medium flowing in the pipeline and the substrate W. When a control temperature is high, the temperature regulation mechanism 36 may be a heater, or may be provided with both a pipeline through which the temperature regulation medium circulates, and a heater. Further, the stage 15 is provided with a plurality of lift pins (not shown) used when the substrate W is loaded/unloaded into/from the interior of the process container 28, so as to be movable up and down with respect to the upper surface of the placement plate 34.

The interior of the process container 28 is partitioned by a partition plate 37 into a plasma generation space P as an upper space and a processing space S as a lower space. The partition plate 37 functions as a so-called ion trap that suppresses permeation of ions in plasma from the plasma generation space P to the processing space S when inductively-coupled plasma is generated in the plasma generation space P. The plasma generation space P is a space in which plasma is generated, and the processing space S is a space in which the substrate W is etched by radical processing. A first gas supplier 61 and a second gas supplier 62 are provided outside the process container 28.

The first gas supplier 61 supplies an $O_2$ gas, a $H_2$ gas, a $NF_3$ gas which is a fluorine-containing gas, and a noble gas (for example, an Ar gas) to the plasma generation space P. These gases are formed into plasma in the plasma generation space P. The noble gas functions as a plasma generating gas, but also functions as a pressure adjusting gas, a purge gas, or the like.

The second gas supplier 62 supplies a process gas used for the chemical process, for example, the HF gas and the $NH_3$ gas as described above, and the noble gas used as the pressure adjusting gas, the purge gas, a dilution gas, or the like to the processing space S.

An exhaust mechanism 39 is connected to the bottom of the process container 28. The exhaust mechanism 39 includes a vacuum pump and exhausts the interior of the processing space S.

A heat shield plate 48 is provided under the partition plate 37 so as to face the substrate W. The heat shield plate 48 is used to prevent heat, which is accumulated in the partition plate 37 due to repetitive generation of plasma in the plasma generation space P, from affecting a radical distribution in the processing space S. The heat shield plate 48 is formed to be larger than the partition plate 37. A flange portion 48*a* constituting the peripheral portion of the heat shield plate 48 is buried in the sidewall portion 28*a* of the process container 28. A cooling mechanism 50, for example, a refrigerant flow path, a chiller, or a Peltier element, is buried in the flange portion 48*a*.

The lid 29, which is the ceiling portion of the process container 28, is formed of, for example, a circular quartz plate and is configured as a dielectric window. An annular RF antenna 40 for generating inductively-coupled plasma in the plasma generation space P of the process container 28 is formed on the lid 29 and is connected to a radio frequency power supply 42 via a matcher 41. The radio frequency power supply 42 outputs radio frequency power of a predetermined frequency (for example, 13.56 MHz or more)

suitable for plasma generation by inductively-coupled radio frequency discharge, as a predetermined output value. The matcher 41 includes a reactance-variable matching circuit (not shown) for matching impedance on the side of the radio frequency power supply 42 and impedance on the side of the load (RF antenna 40 or plasma).

When a process module that performs only heat treatment is provided, a process module having the above configuration excluding a plasma generation mechanism and a partition plate may be used.

When the etching method according to the above embodiment is carried out by the processing system 10, first, the substrate W having, for example, the structure shown in FIG. 3 is taken out from the FOUP 16 by the transfer arm of the loader module 18, and is loaded into the load lock module 19. After the load lock module 19 is evacuated, the substrate W inside the load lock module 19 is loaded into the process module 13 functioning as the etching apparatus by the transfer arm 14 of the transfer module 12.

Subsequently, a pressure adjusting gas, for example, a $N_2$ gas, is introduced into the process container 28 from the second gas supplier 62, and the substrate W is held for a predetermined time, for example, 120 seconds, on the stage 15 whose temperature is regulated to 80 to 120 degrees C. by the temperature regulation mechanism 36 while setting the internal pressure of the process container 28 to, for example, 1,000 to 2,000 mTorr (133.3 to 266.6 Pa), so that the wafer temperature is stabilized at a predetermined temperature.

Subsequently, after the interior of the process container 28 is purged, the internal pressure of the process container 28 is set to preferably 50 to 300 mTorr (6.67 to 40 Pa), and oxygen-containing plasma is generated to perform a radical oxidation process.

When the radical oxidation process is performed, first, an oxygen-containing gas is supplied from the first gas supplier 61 into the plasma generation space P, and radio frequency power is supplied to the RF antenna 40 to generate oxygen-containing plasma which is inductively-coupled plasma. At this time, the oxygen-containing gas may be an $O_2$ gas alone, or an addition of a $H_2$ gas or F-containing gas to the $O_2$ gas. Further, a noble gas such as an Ar gas may be supplied.

Subsequently, plasma of the oxygen-containing gas generated in the plasma generation space P is transferred into the processing space S via the partition plate 37. At this time, $O_2$ ions are deactivated by the partition plate 37, and mainly O radicals in the plasma are selectively introduced into the processing space S. The surface portion of Si or SiN of the substrate W is oxidized by the O radicals to form an oxide film. Since the process at this time is a process with the O radicals as a main component, ion damage to the substrate W is small.

At this time, for a gas flow rate, the flow rate of the $O_2$ gas may be 50 to 200 sccm. When the $H_2$ gas, the F-containing gas, and the noble gas (the Ar gas) are supplied, the flow rates of the gases may be 200 sccm or less, 3 to 10 sccm, and 30 to 200 sccm, respectively. Plasma generation power may be 400 to 800 W.

After the oxygen-containing plasma process as described above, the interior of the process container 28 is purged, and the oxide film is chemically processed with a gas. At this time, after the internal pressure of the process container 28 may be set in a range of 100 to 1,500 mTorr (13.3 to 200 Pa) and the temperature of the stage 15 (the substrate W) is maintained at a temperature of 80 to 120 degrees C. by the temperature regulation mechanism 36, a process gas including a F-containing gas, for example, a HF gas and an $NH_3$ gas, is supplied from the second gas supplier 62 into the processing space S of the process container 28. As a result, the process gas reacts with the oxide film to produce reaction products that are easily decomposed. For example, the HF gas and the $NH_3$ gas are adsorbed onto the substrate W and react with the oxide film to produce AFS, which is an ammonium fluoride-based compound.

When the HF gas and the $NH_3$ gas are used, the flow rates of the HF gas, the $NH_3$ gas, and the inert gas (Ar gas) may be set to 50 to 100 sccm, 300 to 400 sccm, and 200 to 400 sccm, respectively.

After the above chemical process, the interior of the process container 28 is purged to perform a process of removing the reaction products, for example, AFS which is an ammonium fluoride-based compound. For the removal of AFS, AFS is sublimated by supplying the inert gas into the process container 28 while exhausting the process container 28 in a state where the temperature of the stage 15 (the substrate W) is maintained at a temperature of 80 to 120 degrees C. by the temperature regulation mechanism 36. This sublimation process may be performed inside a process container of a separate apparatus.

The above radical oxidation process, the gas-based chemical process, and the removal process of the reaction products by heating are repeated a plurality of times to etch Si or SiN to a desired thickness. Since the radical oxidation process is performed in this way to form the oxide film and then the gas-based chemical process and the removal process of the reaction products are performed, Si or SiN can be etched with good surface roughness, and the controllability of the etching is also good.

<Other Applications>

Although the embodiments have been described above, it should be noted that the embodiments disclosed herein are exemplary in all respects and are not restrictive. The above-described embodiments may be omitted, replaced or modified in various forms without departing from the scope and spirit of the appended claims.

According to the present disclosure in some embodiments, it is possible to provide an etching method and an etching apparatus capable of etching Si or SiN with good surface roughness.

For example, the apparatus of the above embodiments is merely an example, and apparatuses having various configurations may be used. Further, although the case in which a semiconductor wafer is used as a substrate to be processed has been shown, the substrate to be processed is not limited to the semiconductor wafer, but may be another substrate such as an FPD (flat panel display) substrate represented by an LCD (liquid crystal display) substrate, a ceramic substrate or the like.

What is claimed is:

1. An etching method of etching Si or SiN existing on a substrate, comprising:

forming an oxide film on a surface of the Si or the SiN by performing a radical oxidation process on the substrate in a process container;

performing a gas-based chemical process on the oxide film; and removing reaction products produced by the gas-based chemical process, wherein the forming the oxide film, the performing the gas-based chemical process, and the removing the reaction products are repeated a plurality of times, wherein the radical oxidation process generates oxygen-containing plasma with an oxygen-containing gas and causes oxygen radicals in the oxygen-containing plasma to act on the surface of the Si or the SiN, wherein the oxygen-containing gas is a mixed gas including $O_2$ gas and a F-containing gas, wherein the substrate has a recess and the Si or the SiN is present on a side surface of the recess, and wherein the radical oxidation process includes controlling loading between a frontage and a deepest portion of the recess by adjusting at least one of a pressure in the process container and a ratio of the F-containing gas in the oxygen-containing gas.

2. The etching method of claim 1, wherein whenever the forming the oxide film is performed once, the performing the gas-based chemical process and the removing the reaction products are repeated a plurality of times.

3. The etching method of claim 2, wherein the forming the oxide film and the performing the gas-based chemical process are performed in a same process container.

4. The etching method of claim 3, wherein the removing the reaction products includes sublimating the reaction products from the substrate, and wherein the performing the gas-based chemical process and the removing the reaction products are performed in separate process containers.

5. The etching method of claim 1, wherein the oxygen-containing gas further includes at least one selected from the group of $H_2$ gas and a noble gas.

6. The etching method of claim 5, wherein the F-containing gas is a $NF_3$ gas.

7. The etching method of claim 6, wherein the oxygen-containing plasma is generated by remote plasma in a plasma generation space separate from a processing space in which the substrate is arranged, and the oxygen radicals in the oxygen-containing plasma are supplied to the substrate.

8. The etching method of claim 7, wherein the recess of the substrate has a depth of 4 μm or more.

9. The etching method of claim 8, wherein the gas-based chemical process is performed with a process gas including a fluorine-containing gas.

10. The etching method of claim 9, wherein the process gas including the fluorine-containing gas includes a fluorine-containing gas and a $H_2O$ gas or a reducing gas.

11. The etching method of claim 10, wherein the process gas including the fluorine-containing gas includes a HF gas as the fluorine-containing gas and includes an $NH_3$ gas as the reducing gas.

12. The etching method of claim 11, wherein the reaction products are an ammonium fluoride-based compound produced after the gas-based chemical process.

13. The etching method of claim 1, wherein the forming the oxide film and the performing the gas-based chemical process are performed in the same process container.

14. The etching method of claim 1, wherein the performing the gas-based chemical process and the removing the reaction products are performed in the same process container.

15. The etching method of claim 1, wherein the forming the oxide film, the performing the gas-based chemical process, and the removing the reaction products are performed in the same process container.

16. The etching method of claim 1, wherein the gas-based chemical process is performed with a process gas including a fluorine-containing gas.

* * * * *